United States Patent
Loboda

(10) Patent No.: US 10,106,912 B2
(45) Date of Patent: Oct. 23, 2018

(54) REACTION CELL FOR GROWING SIC CRYSTAL WITH LOW DISLOCATION DENSITY

(71) Applicant: Dow Corning Corporation, Midland, MI (US)

(72) Inventor: Mark Loboda, Bay City, MI (US)

(73) Assignee: DOW SILICONES CORPORATION, Midland, MI (US)

(*) Notice: Subject to any disclaimer, the term of this patent is extended or adjusted under 35 U.S.C. 154(b) by 0 days.

(21) Appl. No.: 15/421,220

(22) Filed: Jan. 31, 2017

(65) Prior Publication Data

US 2017/0137964 A1 May 18, 2017

Related U.S. Application Data

(62) Division of application No. 13/963,989, filed on Aug. 9, 2013, now Pat. No. 9,738,991.

(60) Provisional application No. 61/761,179, filed on Feb. 5, 2013.

(51) Int. Cl.
*C30B 23/02* (2006.01)
*C30B 23/00* (2006.01)
*C30B 29/36* (2006.01)
*C23C 14/22* (2006.01)
*C23C 14/06* (2006.01)

(52) U.S. Cl.
CPC ........ *C30B 23/005* (2013.01); *C23C 14/0635* (2013.01); *C23C 14/22* (2013.01); *C30B 23/025* (2013.01); *C30B 29/36* (2013.01)

(58) Field of Classification Search
CPC ..... C30B 23/00; C30B 23/002; C30B 23/005; C30B 23/02; C30B 23/025; C30B 23/06; C30B 29/00; C30B 29/10; C30B 29/36; C23C 14/0635; C23C 14/22; Y10T 117/00; Y10T 117/10; Y10T 117/1016
USPC .......... 117/84, 106–107, 109, 200, 204, 911, 117/937, 951

See application file for complete search history.

(56) References Cited

U.S. PATENT DOCUMENTS 6,534,026 B2 * 3/2003 Vodakov ................. C30B 23/00
   423/345
6,786,969 B2   9/2004 Kondo et al.

FOREIGN PATENT DOCUMENTS

CN      102187019      9/2011
JP      2011020860     2/2011
JP      2011020860 A * 2/2011

OTHER PUBLICATIONS

Tupitsyn, E. Y., et al: "Controllable 6H—SiC to 4H—SiC polytype transformation during PVT growth", Journal of Crystal Growth, vol. 299, pp. 70-76, 2007.

* cited by examiner

*Primary Examiner* — Kenneth A Bratland, Jr.
(74) *Attorney, Agent, or Firm* — Womble Bond Dickinson (US) LLP; Joseph Bach, Esq.

(57) ABSTRACT

A method of forming an SiC crystal, the method including: placing a SiC seed in a growth vessel, heating the growth vessel, and evacuating the growth vessel, wherein the seed is levitated as a result of a temperature and pressure gradient, and gas flows from a growth face of the seed, around the edge of the seed, and into a volume behind the seed, which is pumped by a vacuum system.

20 Claims, 5 Drawing Sheets

Figure 1 – Prior Art

REACTION CELL FOR GROWING SIC CRYSTAL WITH LOW DISLOCATION DENSITY

RELATED APPLICATION

This is a divisional application of U.S. patent application Ser. No. 13/963,989, filed on Aug. 9, 2013, which claims the benefit of priority from U.S. Provisional Application No. 61/761,179, filed on Feb. 5, 2013, and the disclosures of which are hereby incorporated herein by reference in their entireties.

BACKGROUND

1. Field

This disclosure relates to production of silicon carbide with low dislocation density count and to method and apparatus for supporting an SiC seed during physical vapor transport growth.

2. Related Art

Silicon carbide, SiC, is a crystalline semiconductor material, recognized by those familiar with materials science, electronics and physics as being advantageous for its wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C—SiC polytype refers to a repeat unit of 3 and a cubic (C) lattice, while a 4H—SiC polytype refers to repeat unit of 4 and a hexagonal (H) lattice.

The different silicon carbide polytypes have some variations in materials properties, most notably electrical properties. The 4H—SiC polytype has the relatively larger bandgap while the 3C—SiC has a smaller bandgap, with the bandgaps for most other polytypes falling in between. For high performance power device applications when the bandgap is larger, the material is more capable, in theory, to offer relatively higher power and thermal conductivity performance.

SiC crystals do not occur in nature and as such must be synthesized. Growth of SiC crystals can be executed by sublimation/physical vapor transport (PVT) or chemical vapor deposition.

Growth of SiC by sublimation is very challenging. Temperatures in excess of 2,000° C. are required to generate vapor stream of Si/C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The growth is usually performed in a graphite container within a vacuum chamber. The graphite container is heated by either resistive methods or induction methods. The container is insulated in a careful manner so as to create controlled temperature gradients within the volume. A seed crystal is used, which is usually shaped like a plate or disc. The seed crystal is typically oriented with its growth surface facing the source material. The location of the seed crystal in the container is designed such that when the container is heated, the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Historically, initial progress in SiC sublimation-based crystal growth is described first by Lely (U.S. Pat. No. 2,854,364) whose method of unseeded crystal growth resulted in small hexagonal SiC platelets. In the 1970s and 1980s the art to produce the first crystals of size attractive for producing devices was done in Russia by Tairov and Tsvetkov (Journal of Crystal Growth, 52 (1981) p. 146-50 and *Progress in Controlling the Growth of Polytypic Crystals in Crystal Growth and Characterization of Polytype Structures*, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866,005) revealed improvements by judicious selection of source materials and gradient controls. Refinements on the methods of Tairov, Tsvetkov and Davis continue to be revealed to this day.

When methods to produce larger crystals emerged, focus also moved to control defects in the crystals. Defects can be categorized as inclusions and crystal dislocations. The primary crystalline defects in SiC crystals are screw dislocations. Among these are a special case known as a micropipe or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and the crystal during growth can result in formation of dislocations. Deviation of the stoichiometry in the sublimation vapor stream from that needed to form SiC can result in unstable polytype growth—in turn leading to polytype inclusions in the grown crystal, which lead to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5,000-10,000/$cm^2$, respectively. The dislocations are most commonly assessed by sectioning the crystal in the plane normal to the crystal axis of symmetry. Etching the exposed crystal surface with molten salt, like potassium hydroxide, at temperatures in the 350-500° C. range will reveal the dislocations. Each dislocation type has a unique shape so they can be uniquely counted. The dislocations are commonly counted and reported as a number divided by the inspection area. This characterization method is useful as it allows for easy correlation of defects contained in planar semiconductor devices formed on the crystal plane. There are many examples in the literature which show that dislocations are not uniformly distributed in the plane of observation. The large count of dislocations makes it very impractical to count every single one, especially as today inspections can be required on sections greater than or equal to the equivalent of 100 mm diameter circles. Therefore, the etched area is sampled to determine the amount of dislocations. However, incorrect sampling methods can lead to errors in the estimation of the dislocation concentration associated with larger crystals. In most reports, the details of the sampling method are not provided, so replication of reported results can often be difficult, if not impossible.

Scientists experienced in solid state physics and semiconductor devices know that dislocations result in device performance below the theoretical properties of the material. Therefore, modern effort focused on improvements of semiconductor SiC crystal quality look to identify and control the factors which can reduce defects originating in crystal growth.

Once large enough crystals are produced, the crystal must be cut and fabricated into wafers in order to be useful to fabricate semiconductor devices using planar fabrication methods. As many semiconductor crystals (e.g., silicon, gallium arsenide) have been successfully developed and commercialized into wafer products, the methods to fabricate wafers from bulk crystals are known. A review of the common approaches to, and requirements for wafer fabrication and standard methods of characterization, can be found in Wolf and Tauber, Silicon Processing for the VLSI Era, Vol. 1—Process Technology, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives needs to be changed beyond commonly used materials. It has been reported that substantial subsurface damage is observable on mirror polished SiC wafers, and this can be reduced or removed by using chemical enhanced mechanical polishing methods similar to that used in the silicon industry (Zhou, L., et al., *Chemomechanical Polishing of Silicon Carbide*, J. Electrochem. Soc., Vol. 144, no. 6, June 1997, pp. L161-L163).

In order to build semiconductor devices on SiC wafers additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate, the CVD process will produce three dimensional defects on the surface, and such defects will result in non-operational semiconductor devices. Surface imperfections, such as cracks, subsurface damage, pits, particles, scratches or contamination will interrupt the replication of the wafer's crystal structure by the CVD process (see, for example, Powell and Larkin, *Phys. Stat. Sol.* (b) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. *Transactions Third International High-Temperature Electronics Conference*, Volume 1, pp. 11-3-11-8, Sandia National Laboratories, Albuquerque, N. Mex. USA, 9-14 Jun. 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, *IEEE Electron Device Letters*, vol. 15, no. 2, pp. 63-65, (1994)). Neudeck reviewed the impact of crystal (wafer) and epitaxy originated defects on power devices in 1994, highlighting limitations of power device function due to screw dislocations and morphological epitaxy defects (Neudeck, Mat. *Sci. Forum*, Vols 338-342, pp.1161-1166 (2000)). Hull reported shift to lower values in the distribution of high voltage diode reverse bias leakage current when the diodes were fabricated on substrates having lower screw dislocation density (Hull, et. al., *Mat. Sci. forum*, Vol. 600-603, p. 931-934 (2009)). Lendenmann reported forward voltage degradation in bipolar diodes was linked to basal plane dislocations in the epilayer that originate from basal plane dislocations in the substrate (Lendenmann et. al., *Mat. Sci. Forum*, Vols 338-342, pp.1161-1166 (2000)).

Modern technology for growth of 4H—SiC crystals has not been successful to develop a commercial method for a crystal growth process that allows simultaneous control over the gamut of dislocation types.

Various methods disclosed in the prior art are often lacking detail regarding the specific steps employed in the crystal growth or the methods employed to assess the concentration of defects and demonstrate repeatability.

In recent years, it has become desirable to grow larger crystals of silicon carbide and gallium nitride. Currently, most growth processes utilize vapor-based transport methods such as physical vapor transport (PVT) sublimation methods.

For example, crystals of SiC may be grown by PVT in a reaction cell which is typically formed from solid graphite. The cell is typically a right angle cylinder and the grade of graphite is chosen so that its thermal expansion coefficient is close to that of SiC in order to minimize stresses imparted by the differences in the respective coefficients of expansion. The SiC seed crystal is typically provided in a disk shape. The seed crystal is polished and can be coated on the side opposite the growth surface with a material which is stable at the growth temperatures. The presence of a protective carbon coating is important to suppress deterioration of the seed during the crystal growth process, showing that voids ("thermal evaporation cavities") form in the seed when the protection is absent.

The seed is generally oriented in the reaction cell so that the major axis of the cylindrical reaction cell and the plane of the seed wafer are nominally at right angles to each other. In most PVT reaction cells, the seed crystal is placed above the Si/C source feedstock to aid in controlling vapor flow as well as keeping the seed free of debris and contamination during growth. In this type of PVT reaction cell arrangement, the seed is typically supported above the vapor source by rigid or mechanical attachment of the seed to the lid of the reaction cell. The seed may be attached to the lid by adhesive, cement, retaining rings, and the like. However, the act of mounting the seed to the reaction cell lid or seed holder can lead to undesirable effects during crystal growth.

For example, during the mounting process, scratching of the coated seed back may occur. In addition, a void may be created between the seed and reaction cell ceiling interface during the mounting process. Such occurrences may exacerbate formation of evaporation cavities of the seed backside, resulting in defect formation. Moreover, differences in thermal expansion between the seed and lid can cause stresses in the seed. See, for example, discussion in Japanese patent publication JP 2011-20860.

It is important to support the seed crystal in the reaction cell in a position where the temperature can be controlled to allow condensation of the vapor stream on the seed surface. However, because the reaction cell is typically made from a different material than the seed crystal, the rigid attachment methods often create stresses in the crystal during growth. For example, when the seeds are mounted to the reaction cell or lid using an adhesive, it is possible for the seed to be bent during the mounting process, which results in undesirable stress in the crystal.

As a result, attempts have been made to develop alternative methods for supporting the seed crystal during growth. For example, JP 2011-20860 relies on pressure differentials to create vacuum that holds the seed against the lid. However, contact between the crystal and holder is such that stress on the crystal may still occur during growth. Specifically, pressure differential forces may deform the seed. Moreover, if the lid's surface is not smooth and flat, it will create pressure points on the back surface of the seed, thereby generating strains in the seed. Similarly, any particulate material that may inadvertently be captured between the seed and the lid would create pressure point. Even if the lid is perfectly flat such that the seed perfectly contacts the lid, when seed touches the lid it will cool the backside of the seed, causing it to bow away from the lid and the seal will be broken. Also, the bowing will cause the crystal to be in stress, leading to defects in the growing crystal.

There are other problems with the approach disclosed in the JP 2011-20860. For example, when the seed is elevated due to pressure differential, it blocks gas flow out of the crucible, thus leading to increased pressure and temperature inside the crucible. At least for these reasons it is preferred to maintain the flow of gas out of the crucible. Also, as the crystal grows it gets heavier and at some point will be too heavy for the pressure differential to maintain it against the lid, at which point the crystal would drop, leading to sudden change in the temperature of the crystal and due to resumed flow of gas out of the crucible, reduced pressure and temperature inside the crucible.

Accordingly, there is a need in the art for a method of SiC crystal growth, which results in crystal growth with minimized stress resulting in reduced defects such as micropipes, screw dislocations and basal plane dislocations.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the present invention are directed to support for a seed crystal during vapor-based crystal growth, and more particularly, to a vapor transport growth method wherein the seed crystal is not subjected to external stress during crystal growth.

According to aspects of the invention, a method of forming an SiC crystal is provided, the method comprising: placing a seed crystal, obtained from a bulk crystal of a hexagonal polytype of SiC, on a shelf of an insulated graphite container thereby defining a volume between ceiling of the graphite container and back surface of the seed; placing a source of silicon and carbon atoms in the insulated graphite container, wherein the source of silicon and carbon atoms is for transport to the seed crystal to grow the SiC crystal; placing the graphite container inside a furnace; heating the furnace to a temperature from about 2,000° C. to about 2,500° C.; and, evacuating the induction furnace to a pressure of from about 0.1 Torr to about 100 Torr, while directing gas flow from below the seed crystal through a periphery of the seed crystal and to a center of the volume between ceiling of the graphite container and the back surface of the seed, to thereby facilitate vapor transport from the source of silicon and carbon atoms to the seed, while preventing the back surface of the seed from contacting any part of the graphite container.

According to further aspects, a method is disclosed wherein the temperature and pressure inside a vacuum furnace is maintained to enable SiC crystal growth of 0.1-50 mm thick with nitrogen concentration in the growth being from $1\times10^{15}$ to $1\times10^{19}/cm^3$.

According to other aspects, a seed for crystal growth is provided, wherein the seed is of a 4H—SiC polytype with offcut from 0-4 degrees toward the (11-20) crystalline orientation and a nitrogen concentration of the seed crystal is from about $1\times10^{16}/cm^3$ to about $8\times10^{18}/cm^3$.

Further aspects provide a 4H—SiC substrate having an averaged micropipe density of less than about $1/cm^2$, wherein the 4H—SiC substrate has a screw dislocation density of less than about $5,000/cm^2$, and wherein the 4H—SiC substrate has a basal plane dislocation density of less than about $5,000/cm^2$ as determined from at least 9 measurements made on the 4H—SiC substrate. These metrics are achieved simultaneously. The substrate can be used as a seed crystal or as a substrate used in fabrication of semiconductor devices.

Yet other aspects provide a reaction cell suitable for SiC crystal growth by physical vapor transport wherein a seed is levitated as a result of a temperature and pressure gradient, and gas flows from a growth face of the seed, around the edge of the seed, and into a volume behind the seed, which is pumped by a vacuum system. The reaction cell is fabricated such that the back surface of the seed is prevented from contacting any part of the container. For example, the lid may be constructed with a peripheral ring extension that is configured to contact the peripheral edge of the seed and prevent that back surface of the seed from touching the surface of the lid.

Additionally, a furnace system for forming an SiC crystal is provided, the system comprising: an insulated graphite container having a lid on top portion thereof, and a shelf for an having an insulated graphite container having a lid on top portion thereof and a shelf for supporting a seed crystal, the shelf being positioned below the ceiling and configured to prevent the back surface of the seed from contacting the surface of the lid; a means for directing gas flow from a periphery of the seed crystal to the center of a volume behind the seed crystal; an evacuation path configured for allowing a vapor flux to pass through the lid; a heater for heating the graphite container to a temperature from about 2,000° C. to about 2,500° C.; vacuum pump for maintaining interior of the graphite container at a pressure from about 0.1 Torr to about 100 Torr; and, a gas inlet for filling the furnace with an inert gas and or doping gas. The lid may include an extension configured for engaging peripheral edge of the seed so as to prevent the back surface of the seed from contacting the surface of the lid.

Further aspects also involve a method for SiC crystal growth by physical vapor transport, comprising placing a SiC seed in a growth vessel, heating the growth vessel, and evacuating the growth vessel, wherein the seed is levitated as a result of a temperature and pressure gradient, but is prevented from having its back surface contact the surface of the lid, and gas flows from a growth face of the seed, around the edge of the seed, and into a volume behind the seed, which is pumped by a vacuum system.

Other aspects and features of the invention would be apparent from the detailed description, which is made with reference to the following drawings. It should be appreciated that the detailed description and the drawings provides various non-limiting examples of various embodiments of the invention, which is defined by the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

The following provides examples of fabrication methods according to embodiments of the invention, which result in substrates of relatively large diameter while exhibiting low micropipes, screw and basal plane dislocations densities. According to disclosed embodiments, the seed is not physically attached to any part of the vessel during growth, but is rather allowed to freely move within constraining boundaries. The constraining boundaries allow horizontal (expansion and contraction) and vertical movement of the seed during processing, but the vertical movement is limited such that the back surface of the seed is prevented from contacting the surface of the lid. In some embodiment, vertical movement is facilitated by creating differential pressure and/or upward flow of gases within the processing vessel. In some embodiments the back surface of the seed is prevented from contacting the surface of the lid by having an extension ring, an o-ring, or similar contract for contacting the peripheral edge of the seed to thereby maintain a space between the back surface of the seed and the surface of the lid. Examples of how to achieve such a growth will be described below with reference to the embodiments illustrated in FIGS. 2-4. Of course, other manners of achieving the results described herein may be used without departing from the scope and/or spirit of this disclosure.

Features of the invention can be understood from the following description of examples of methods for producing a 4H—SiC crystal/wafer exhibiting micropipe density of less than $1/cm^2$, screw dislocation density of less than $5,000/cm^2$ and basal plane dislocation density of less than $5,000/cm^2$. That is, the disclosed crystal exhibits all three low defect density requirements simultaneously. The 4H—SiC crystals can be grown using seeds of diameter as small as 76 mm or up to and exceeding 150 mm diameter.

According to the following embodiments, the process begins with an SiC seed, which is generally in the shape of a circular wafer of about the same diameter as the grown crystal. The seed crystals are polished and/or etched on the carbon face to ensure that the surface is free of mechanical damage. A modified arrangement for crystal growth is utilized, to improve growth on the seed. To fully understand the required modifications, a growth arrangement according to the prior art will be described first.

Figure 1:
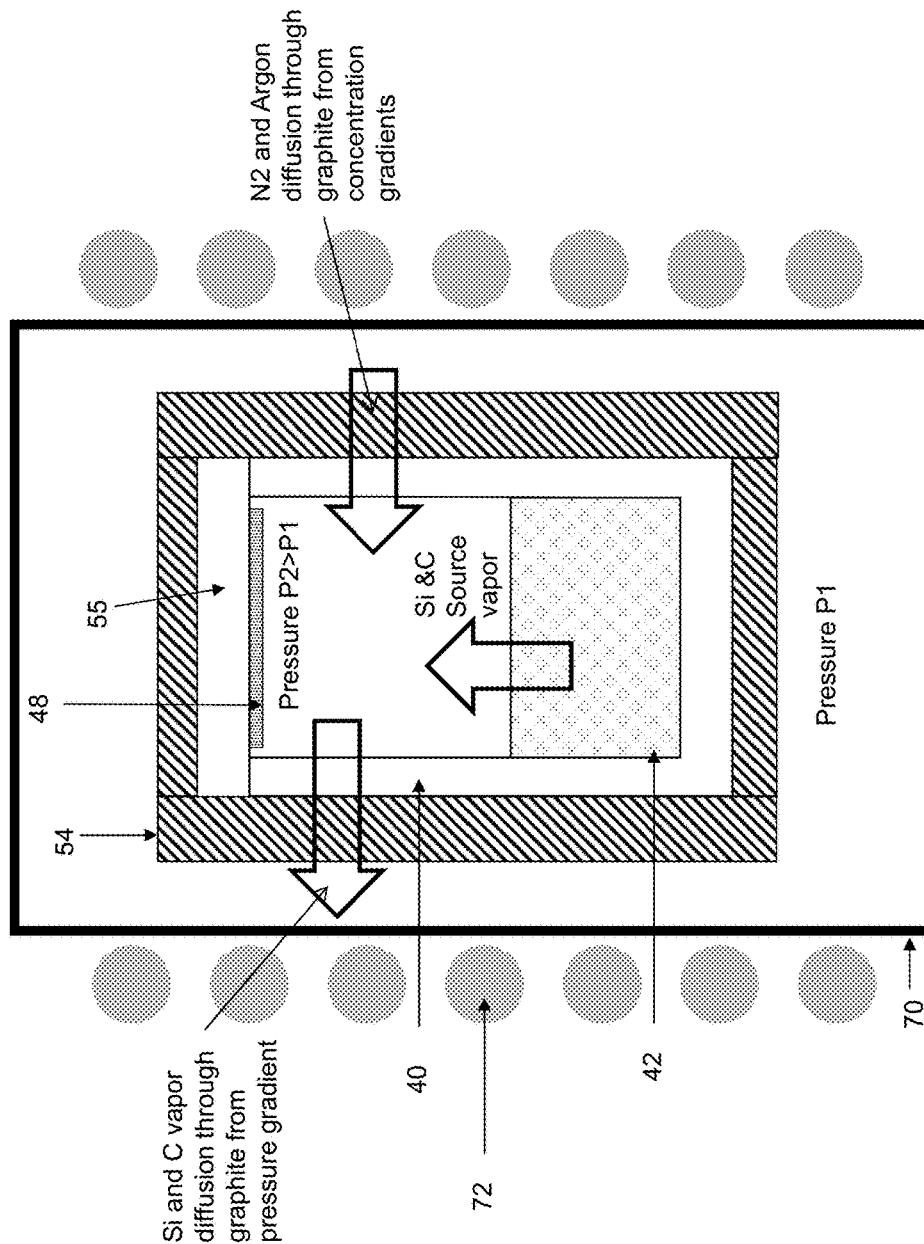
FIG. 1 is a schematic of a prior art arrangement for growth of SiC crystals by physical vapor transport.

FIG. 1 shows a generic arrangement for growth of SiC crystals by physical vapor transport, indicative of the prior art. A PVT reaction cell 40 is illustrated, which is configured for SiC crystal growth. The reaction cell 40 is typically formed from a graphite vessel with graphite lid 55. Granulized SiC or silicon and carbon material 42 is placed in the bottom of the cell. Positioned in the upper portion of the vessel is a seed crystal 48, which is physically mounted or bonded to the inside of the lid of the cell. The entire vessel 40 is surrounded with insulation 54, such as graphite felt or foam. The reaction cell 40 is placed in a vacuum furnace 70 which is pumped by a vacuum pump. The vacuum furnace 70 may be comprised of steel if the cell is resistively heated, or it may be comprised of quartz, glass or other dielectric material if the cell is inductively heated. In the embodiments shown, the vacuum furnace is comprised of glass and is heated by an RF induction coil 72. Silicon and carbon evaporate from the source material 42 and condense onto the seed 48. Silicon and carbon that has not condensed onto the seed is diffused out of the reaction vessel and into the vacuum furnace. This diffusion is driven by pressure gradient between the interior of the reaction vessel and the vacuum furnace. Gases that are being injected into the vacuum furnace, such as nitrogen, argon, and dopants, diffuse through the graphite crucible walls and into the reaction vessel. This diffusion is driven by concentration gradient between the vacuum chamber and the interior of the reaction vessel.

Embodiments of the method described herein provide several advantages over prior methods and apparatus for seed crystal growth. As noted above, most prior art connects the seed with contact between the back surface of the seed and the top of the crucible or reaction cell or to the lid. We have found that such contact is unnecessary and may be detrimental to crystal formation. We have unexpectedly found that by minimizing the contact between the seed and the cell, the stresses imparted to the crystal during growth are also minimized. We have also unexpectedly found an improvement in the quality of the grown crystal as evidenced by the low crystal defect density.

Various disclosed configurations of the innovative support minimize damage to or bending of the seed crystal during the mounting process, and because the seed crystal is mechanically decoupled from the reaction cell, the seed crystal may expand and contract independently of the reaction cell during growth. The following are example of the seed support to achieve the improved crystal growth.

Figure 2:
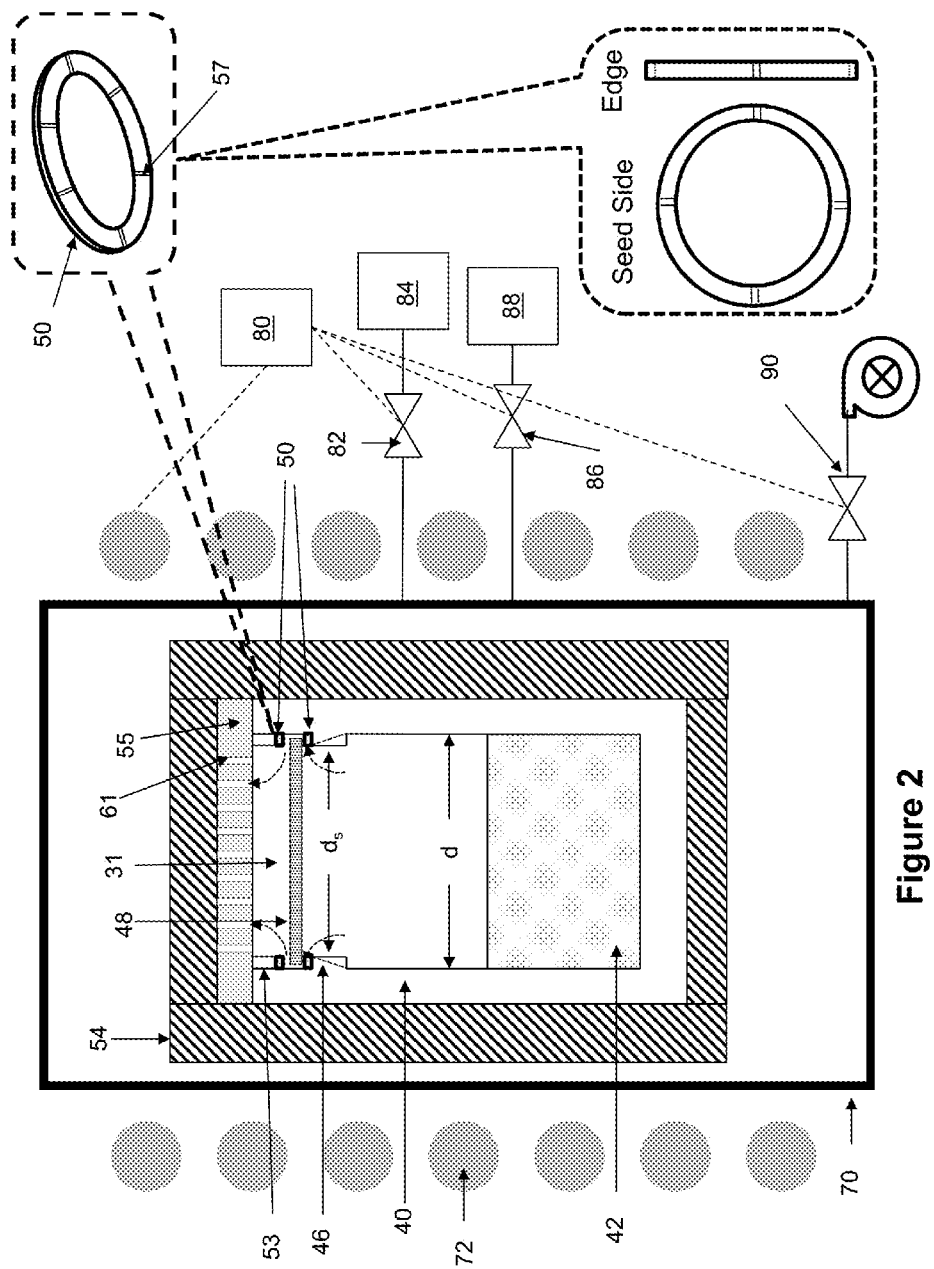
FIG. 2 is a schematic of an arrangement for growth of SiC crystals by physical vapor transport according to one embodiment.

Referring now to FIG. 2, a PVT reaction cell according to one embodiment of this invention is illustrated, which is configured for SiC crystal growth. The reaction cell 40 is preferably formed from a graphite vessel, with graphite lid 55. The cell has an interior diameter designated as "d" in FIG. 2, which is slightly larger than the diameter of the seed 48. Additionally, a shelf 46 is provided in the upper portion of the cell. The shelf 46 has an inner diameter, designated "$d_s$" in FIG. 2, which is slightly smaller than the diameter of the seed 48. The shelf 46 can be made as a ring of graphite bonded to the sidewall of the vessel. Alternatively, the shelf 46 may be made integrally with the vessel, e.g., the vessel may be formed with the shelf as integrated part of the interior sidewall of the vessel 40. Of course, the walls of the shelf need not be vertical, but instead may be slanted, as shown by the dotted line, in which case the diameter "$d_s$" can have a larger value on the source side of the shelf than on the seed side.

Shelf 46 is used for supporting the seed crystal 48 at its peripheral edge, without any physical attachment. Rather, seed 48 is simply placed inside the vessel so as to rest on the shelf 46. A graphite retainer, 53 is then placed above the seed without contacting the seed, so as to maintain free space above the seed, but allow the seed freedom to move vertically within the bounded space. The retainer 53 is configured to prevent the seed from moving vertically to an extent that the back surface of the seed would contact the surface of the lid 55. In some embodiments, the retainer 53 is formed as part of the lid 55. For example, the retainer 53 may be a ring extension machined or made integrally to the lid 55.

Optionally, one gas channel ring, 50, is provided at the bottom of the graphite retainer or spacer 53, and another one is provided below the seed, and is used to direct the gas into the gap 31 between the lid 55 and the seed 48. Example of gas channel ring 50 is shown in the callout, illustrating grooves 57 that are provided on the surface facing the seed and which assist in gas flow. It is generally in the shape of a flat washer, having flow channels 57 at its underside, i.e., the side facing the seed 48. The secondary callout illustrates a variant of the ring 50 wherein the grooves 57 are provided on the surface facing the seed and on the outer edge of the ring 50. In this example, the gas exits the cell 40 through the gas collector 61 in lid 55; however, the gas collector can be any geometry or material that increases the conductance of the gas in the direction out of the top of the cell relative to the radial direction. Generally, the arrangement is configured so as to generate gas flow from below the seed 48, around the seed and through the gas channel ring 50 into gap 31, and out of the top of the vessel, as shown by the broken-line arrows in FIG. 2. Both the gas channel fitting and the gas collector should be constructed of a material compatible with the process temperature and chemistry used in SiC crystal growth, e.g., graphite, molybdenum, etc. This overall arrangement allows the seed to be bound in its vertical motion so as to maintain gap 31 between the lid and the back surface of the seed. This way the back surface of the seed never contacts the lid and stresses that may be cause due to such contact are avoided. Also, the arrangement allows the seed to be free to expand and contract without imparting stress to the seed from the cell upon heating and cooling.

Figure 3:
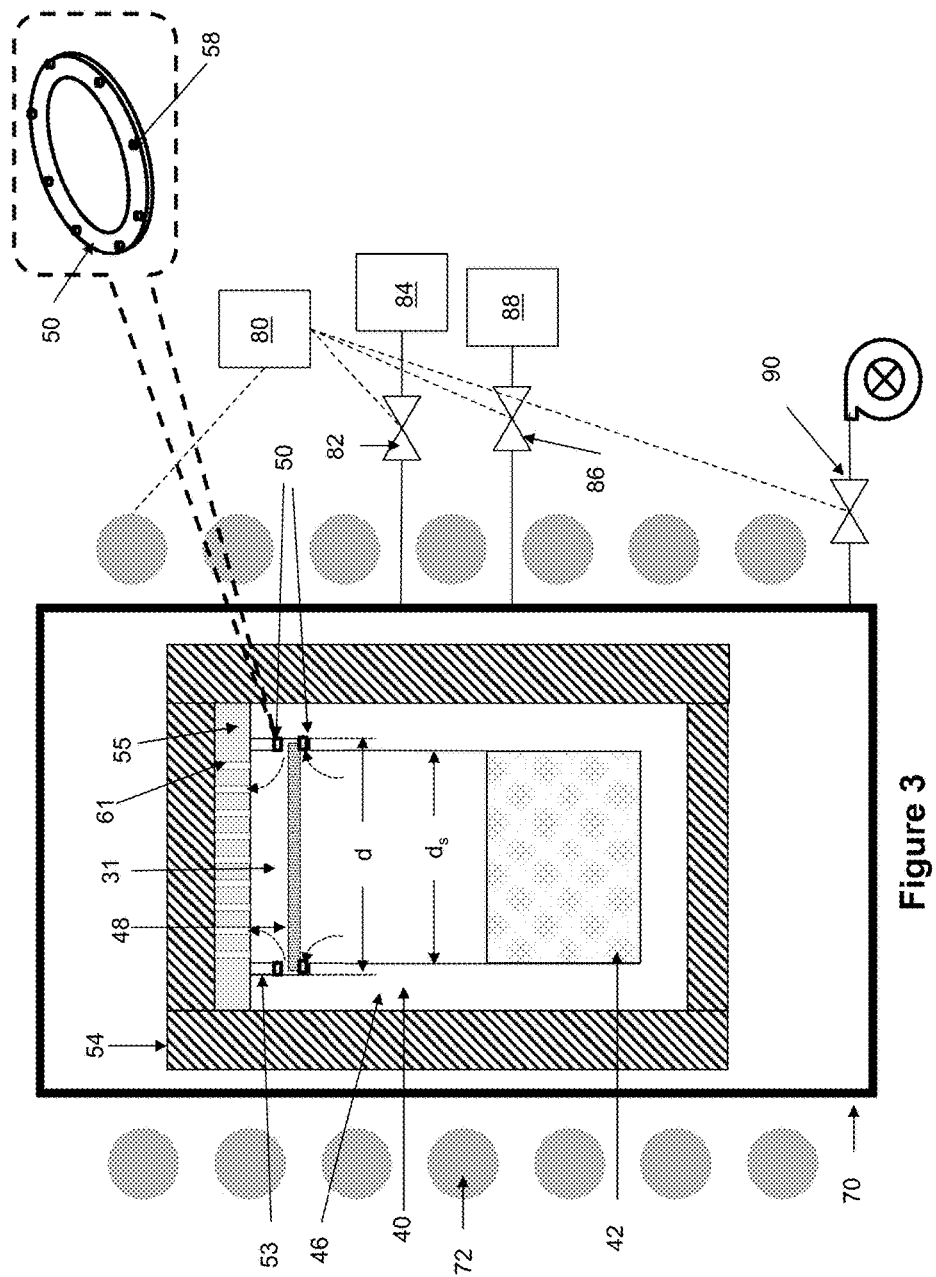
FIG. 3 is a schematic of an arrangement for growth of SiC crystals by physical vapor transport according to another embodiment.

FIG. 3 illustrates another embodiment for forming the shelf 46 as integral part of the cell 40. Specifically, the cell 40 is fabricated such that its interior diameter is slightly smaller than that of the seed 48, similar to diameter $d_s$ in the embodiment of FIG. 2. The upper part of the cell 40 is fabricated to have a diameter that is slightly larger than the diameter of seed 48, i.e., similar to diameter d in the embodiment of FIG. 2. The difference between the two diameters forms shelf 46, upon which the seed 48 rests. Thus, as can be understood, various configuration can be used to facilitate the shelf 46, and the particular configuration used is not essential, provided that the seed can be placed in a resting orientation on the shelf, such that the seed can expand and contract freely without having physical constraints. Also, the shelf should be positioned a distance below the top of the cell 40 such that the seed may be free move slightly in the vertical direction, but would be prevented from contacting the surface of the lid.

Another variant illustrated in FIG. 3 is of a gas flow ring 50, shown in the callout. As shown in the callout, gas flow ring 50 is in the shape of a flat washer, having bumps or other extensions 58 provided on the bottom surface thereof, so as to generate a setback from the seed 48, such that the gas is directed to flow between the gas flow ring 50 and the seed 48.

Figure 4:
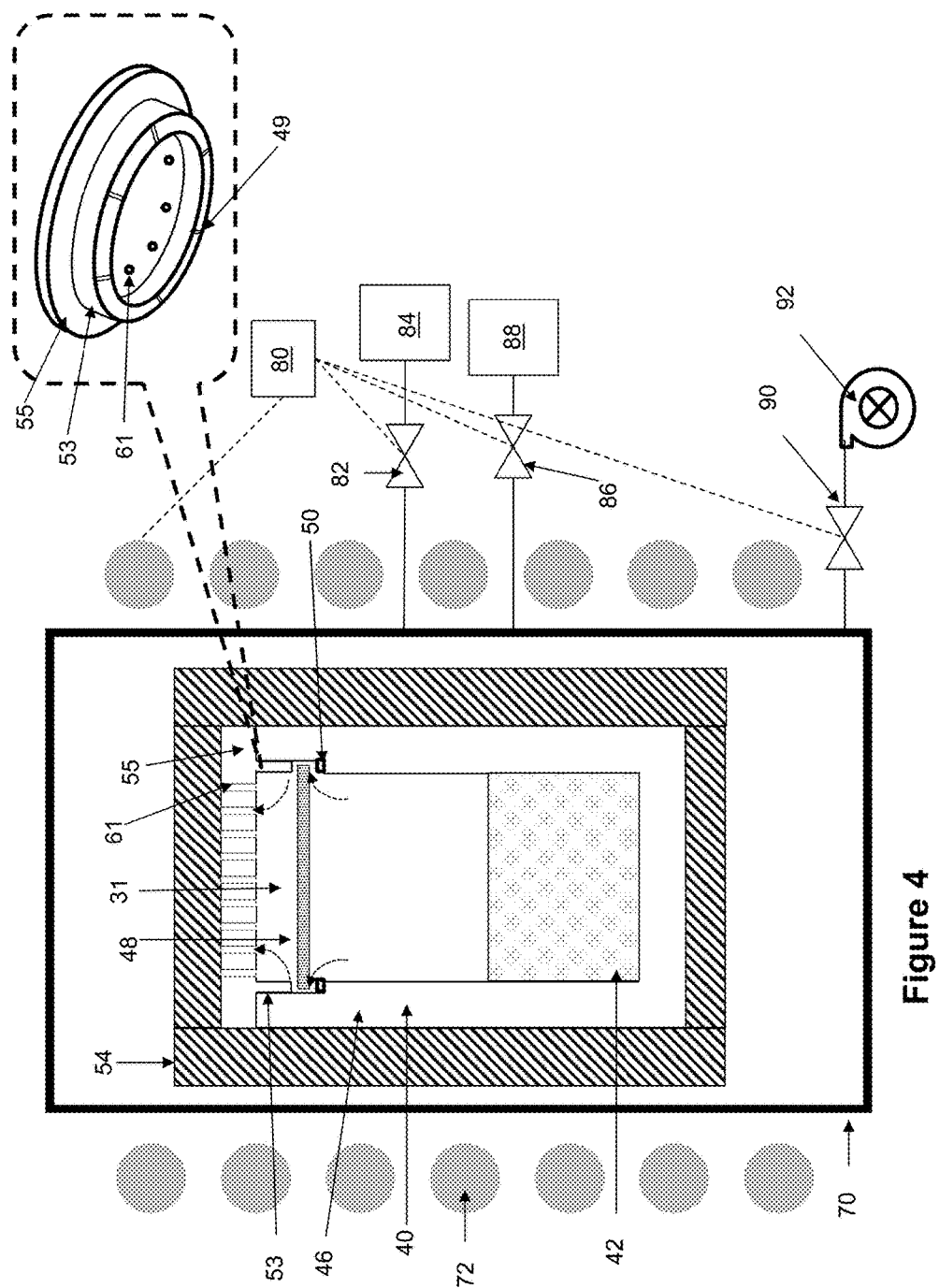
FIG. 4 is a schematic of an arrangement for growth of SiC crystals by physical vapor transport according to yet another embodiment.

FIG. 4 illustrates yet another embodiment, wherein the retainer 53 and the top gas flow ring 50 are incorporated into the lid 55. As shown in the callout, lid 55 is formed integrally with an extension 53, which functions as a retainer ring 53. Gas flow channels 59 are formed at the bottom of the extension 53, to function as channels 57 in the gas flow ring 50. When the lid 55 is placed on top of the vessel, it forms gap 31 between the lid 55 and the seed 48. The bottom gas flow ring allows gas to enter from below the seed. Also, as in the previous embodiments, there's setback space for the seed 48 to move vertically, but its vertical movement is bounded by the extension 53 such that its back surface never touches the surface of the lid. Also, holes 61 are provided in the lid 55 to enable pumping of gas out of the vessel through the lid 55.

Figure 5:
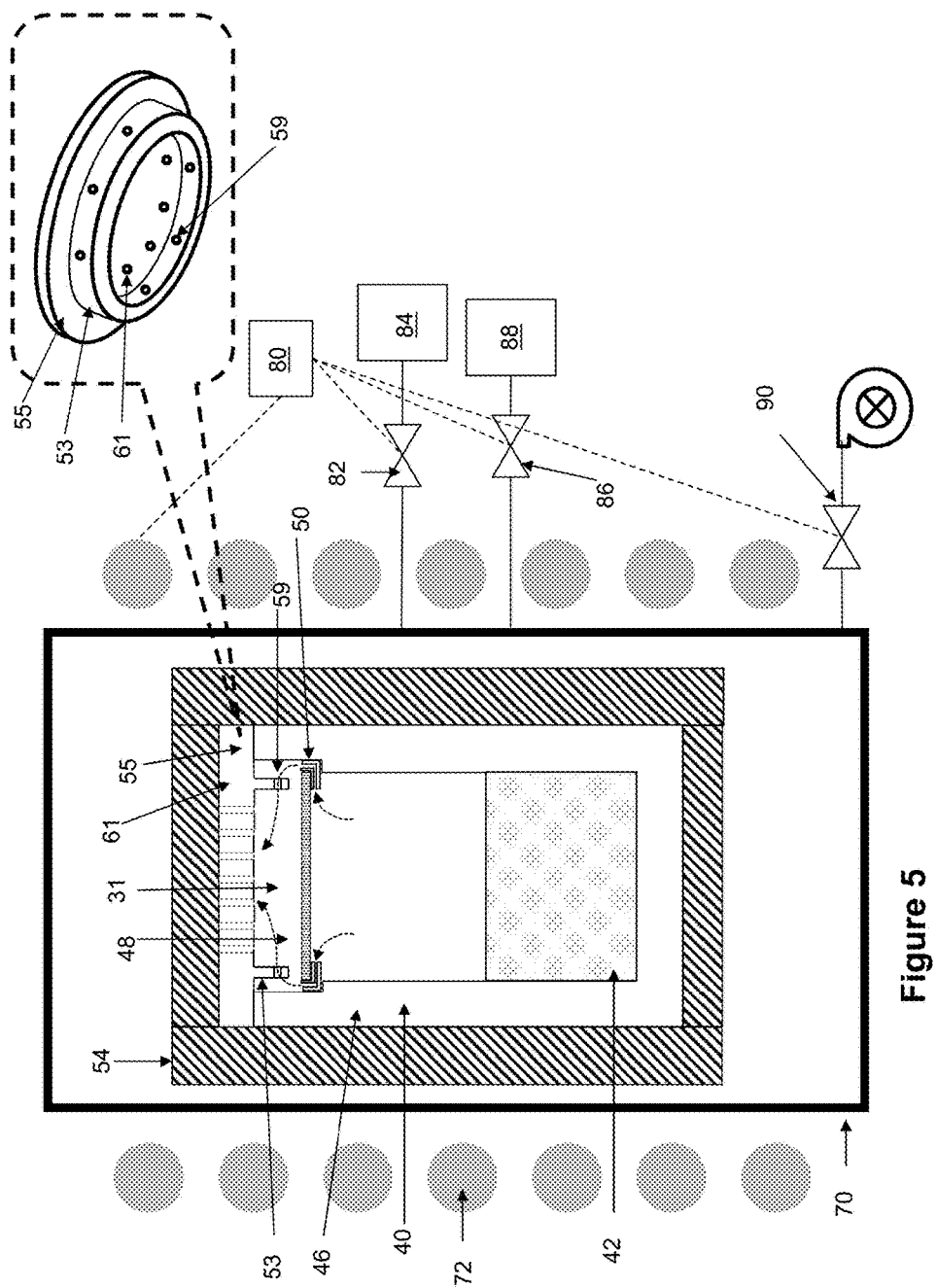
FIG. 5 is a schematic of an arrangement for growth of SiC crystals by physical vapor transport according to yet another embodiment.

FIG. 5 illustrates another variation of the embodiment of FIG. 4. According to the embodiment of FIG. 5, the lid 55 is formed integrally with an extension 53, which functions as a retainer ring 53. Gas flow holes 59 are formed on the sidewall of the extension 53, to function as channels 57 in the gas flow ring 50. The ring 50 placed under the seed has a horizontal channel leading to a vertical channel to enable gas flow from under the seed to above the seed, as illustrated by the broken-line arrows.

The following description is applicable regardless of the specific embodiment utilized. The entire vessel 40 is surrounded with insulation 54 such as graphite felt or foam. The thickness, thermal conductivity, and porosity of the insulation are chosen so as to achieve a desired temperature distribution in the reaction cell. The arrangement for growth of SiC crystals can include a controller 80 for controlling a valve 82 to a nitrogen source 84, which is connected to the vacuum furnace 70, and for controlling a valve 86 to an argon source 88, also connected to the vacuum furnace 70. The vacuum inside vacuum furnace 70 is controlled by valve 90 leading to vacuum pump 92. In this embodiment, controller 80 is configured to control vacuum valve 90 and pump 92 so as to maintain a user-set vacuum level inside the vacuum furnace 70, regardless of argon and/or nitrogen flow into the vacuum furnace. For example, if nitrogen flow into the chamber is increased, controller 80 opens the vacuum valve 90 to increase vacuum pumping from the furnace and maintain the set vacuum level. Controller 80 also controls the operation of the heater, such as the power applied to RF induction coil 72.

Once the cell 40 is loaded with the source material 42 and seed 48, it is sealed and is placed into an RF induction furnace 70. The furnace is evacuated using pump 92, thereby creating a pressure differential between the interior of the furnace 70 and the interior of the cell 40. However, cell 40 is constructed such that the lid does not seal the cell fully hermetically and so, gaseous matter from inside the cell 40 leaks to the interior of furnace 70 and is pumped out. Similarly, the walls of cell 40 are somewhat porous to gases and leak into the interior of furnace 70. Consequently, the pumping action of pump 92 also evacuates the interior of cell 40 by creating the pressure differential between the interior of cell 40 and the interior of furnace 70.

The furnace 70 is then backfilled with a non-oxidizing gas such as argon. Pressure is established near atmospheric pressure (500-700 torr) and the container is heated to approximately 1,600-2,500° C. The pressure is subsequently reduced by proper setting of valve 90, to initiate the vapor transport process. Nitrogen or other dopant gas can be added to the furnace to control the conductivity of the grown crystal. At this point the pressure, temperature and nitrogen flow are controlled to achieve the conditions needed to form the bulk SiC crystal on the seed. The thickness of the remaining crystal grown is in the range of 5-50 mm. Typical values of pressure are in the range of 0.1-10.0 torr and temperature in the range of 2,000-2,500° C.

At conditions of temperature, pressure and gas flow promoting vapor transport from the source to the seed crystal there will be a temperature gradient parallel to the axis of symmetry of the seed, with the growth face at a higher temperature than the back side of the seed. This will cause the seed to bow, since the thermal expansion of the seed will be larger on the growth face than the backside. That is, the area of the seed growth face is now larger than the backside, so that the seed bows with its center being lower than its periphery. Since the seed simply rests of shelf 46 and is not held mechanically or physically, this expansion and bowing is not restricted—the diameter of the vessel at the shelf level is sufficiently large to allow for the seed expansion and there is sufficient space above the seed to allow vertical movement of the seed.

At the same time, a pressure gradient is also established across the seed, parallel to the axis of symmetry of the seed, since the growth cell volume containing the source material is at a higher pressure than the gap, 31, above the seed, due to the differential pumping action of the growth furnace. Since the cell 40 is constructed such that gas flow is upwards via the top portion or the lid, gas from below the seed is flowing upwards and around the periphery of the seed. This combination results in a buoyant force across the seed, levitating the seed or floating it upwards until it contacts the gas channel fitting, 50, on the retainer, 53. The seed will maintain this position until such time that the weight of the crystal grown will overcome the buoyant forces, at which time the seed will flow down and rest again of shelf 46 or, if provided, on ring 50. In its buoyant position, the seed is pressed at its peripheral edge against the retainer ring 53, such that the back surface of the seed cannot contact the bottom surface of the lid.

At the end of the growth process, the pressure is raised to approximately 600 torr. This suppresses any more vapor transport. The furnace is then cooled to room temperature. When the container is opened, a single crystal of SiC with the same polytype as the seed crystal has formed on the seed crystal.

New seeds can be created from crystals grown by this method and used to prepare new crystals. It is found that each generation of crystals grown shows reduced dislocation density.

The beneficial features of this invention are the cell design which includes a seed confinement section defined by the shelf, retainer, and lid/gas collector, a gap above the seed and a gas channel fitting/gas collector to promote the proper gas flow and differential pressure to initiate levitation of the seed.

To assess the dislocations in the crystal, the crystal is sliced and all slices are polished. Micropipes can be tested by first revealing them with molten salt etching and counting via manual and automated methods, or by scanning the polished slice with a laser light scattering spectrometer and an image processing algorithm to count the micropipes. Methods such as this are described in J. Wan, et. al., "A New Method of Mapping and Counting Micropipes in SiC Wafers" Proc. 2005 Int'l Conf. On SiC and Related Materials, Materials Science Forum (2006), p. 447, and J. Wan, et al., "A Comparative Study of Micropipe Decoration and Counting in Conductive and Semi-Insulating Silicon Carbide Wafers," J. Electronic Materials, Vol. 34 (10), p.1342. Once the total number of defects is counted, this value is divided by the area of the slice measured to derive a defect density in counts per unit area.

Screw dislocations and basal plane dislocations require either molten salt etching as described above or x-ray topography. Counting is generally done by sampling several areas on the slice and counting the defects. The method typically used to report defects consists of a measurement at the center of the wafer, four sites 90 degrees apart at 50% of the wafer radius and four sites 90 degrees apart at >80% of the wafer radius, and rotated 45 degrees to the points at 50% of the radius. The total counts in each site are summed, and then the sum is divided by the measurement area to derive a defect density in counts per unit area. Since the sampling method of larger wafers is important to assessing the wafer, it is often pertinent to report the site count values as well as the net count of defects.

EXAMPLE

A graphite vessel was formed and loaded with a source mixture of silicon and carbon totaling approximately 850 grams. A 4H—SiC seed of approximately 102 mm diameter was fixtured into the cell per the methods described earlier with the C-face facing the source. The graphite assembly was wrapped with graphite felt and placed into a RF induction heated vacuum furnace. The vacuum chamber was evacuated to base pressure and then backfilled with argon gas. The pressure was set to 600 Torr and the system was heated to achieve a temperature of approximately 2200° C. as read by a pyrometer focused on the lid of the graphite vessel. N2 gas was delivered to the chamber at this time and the pressure was dropped below 10 Torr to initiate sublimation of the source. The N2 gas flow was set to a level to deliver a nitrogen concentration in the crystal within the range 3-8E18/cm$^3$. After about 100 hrs the pressure was raised to 600 Torr to stop sublimation and then the system was cooled to retrieve the crystal.

The resulting crystal, designated AG1045, was 15 mm long on the tapered side. Crystal was sliced into wafers which were 100 mm in diameter and offcut 4 degrees toward <11-20>. The wafers were polished using diamond abrasives to achieve a smooth specular surface. Resistivity measurements were performed on the wafers and the values ranged 0.017-0.020 ohm-cm.

Micopipes in the polished wafers were assessed using laser light scattering spectrometry. The wafer area inspected excluded the outer 2 mm. Table below shows the values measured for total micropipes and micropipe density (MPD).

| Wafer | Total Micropipes Observed | MPD ($cm^{-2}$) |
|---|---|---|
| 1 | 4 | 0.06 |
| 2 | 6 | 0.09 |
| 3 | 3 | 0.04 |
| 4 | 1 | 0.02 |
| 5 | 8 | 0.11 |
| 6 | 2 | 0.02 |
| 7 | 6 | 0.09 |

One of the slices was etched in molten KOH to reveal the dislocations. Dislocations were measured at 9 sites on the wafer arranged by radius and angle. The test locations consists of a measurement at the center of the wafer, four sites 90 degrees apart at 50% of the wafer radius and four sites 90 degrees apart at >80% of the wafer radius, and rotated 45 degrees to the points at 50% of the radius. Microscope images were taken at each site and the etch pit density (EPD), which is the sum of all threading, basal and screw dislocations), basal plane dislocation density, and screw dislocation density were determined from the images. The data is tabulated below:

| Site | EPD (cm−2) | Basal Plane Dislocation Density (cm−2) | Screw Dislocation Density (cm−2) |
|---|---|---|---|
| 1 | 5.00E+03 | 0 | 0 |
| 2 | 2.44E+03 | 250 | 125 |
| 3 | 4.69E+03 | 188 | 563 |
| 4 | 2.25E+03 | 188 | 500 |
| 5 | 4.94E+03 | 0 | 1000 |
| 6 | 2.94E+03 | 250 | 750 |
| 7 | 2.75E+03 | 375 | 625 |
| 8 | 3.88E+03 | 250 | 875 |
| 9 | 4.38E+03 | 313 | 375 |

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A reaction cell suitable for SiC crystal growth by physical vapor transport using a seed having a given diameter, comprising:

a graphite container shaped as a right angle cylinder having an interior diameter which is larger than the diameter of the seed and having a shelf on an interior sidewall of the graphite container with an inner diameter which is smaller than the diameter of the seed, such that the seed can be placed on the shelf;

a graphite lid defining a volume between the lid and an exposed back surface of the seed when the seed is placed on the shelf;

flow channels configured for directing gas flow from a periphery of the seed to the volume.

2. The reaction cell of claim 1, further comprising an evacuation path configured for allowing a vapor flux to pass through the lid.

3. The reaction cell of claim 1, further comprising a retainer ring configured to fit above the shelf over the seed, and wherein the gas flow channels are provided on the retainer ring.

4. The reaction cell of claim 3, wherein the retainer ring is formed integrally with the lid.

5. The reaction cell of claim 3, further comprising a second retainer ring configured to fit above the shelf below the seed, and wherein additional gas flow channels are provided on the second retainer ring.

6. The reaction cell of claim 2, wherein the lid comprises gas evacuation holes.

7. The reaction cell of claim 1, wherein the container has internal diameter smaller than that of the seed, and wherein an upper section of the container is made to have an internal diameter larger than that of the seed, and wherein transition from the internal diameter smaller than that of the seed to the diameter that is larger than that of the seed defines the shelf.

8. The reaction cell of claim 1, further comprising a ring placed under the seed wherein the flow channels comprise horizontal channels leading to vertical channels on the ring.

9. The reaction cell of claim 1, wherein the lid comprises an extension configured to bound vertical movement of the seed.

10. The reaction cell of claim 9, wherein the flow channels are formed at bottom of the extension.

11. The reaction cell of claim 9, wherein the extension is made integrally to the lid.

12. The reaction cell of claim 10, further comprising a bottom gas flow ring configured to allow gas to enter from below the seed.

13. The reaction cell of claim 12, wherein the bottom gas flow ring is shaped as a flat washer having flow channels.

14. The reaction cell of claim 12, wherein the bottom gas flow ring is shaped as a flat washer having bumps.

15. The reaction cell of claim 1, wherein the shelf is made as a ring of graphite and is bonded to the interior sidewall.

16. The reaction cell of claim 1, further comprising a channel ring made of graphite or molybdenum.

17. The reaction cell of claim 1, wherein the shelf is made integral to the sidewall.

18. The reaction cell of claim 1, wherein walls of the shelf are slanted.

19. The reaction cell of claim 1, wherein the inner diameter of the shelf has a larger value on source side of the shelf than on seed side of the shelf.

20. The reaction cell of claim 1, wherein the lid comprises a retaining ring extending from bottom surface thereof and having diameter configured to engage peripheral edge of the seed.

* * * * *